United States Patent [19]

Takasugi

[11] Patent Number: 4,507,767
[45] Date of Patent: Mar. 26, 1985

[54] CONTROL CIRCUIT FOR CONTROLLING LIGHT SOURCE IN OPTICAL DISC DEVICE

[75] Inventor: Wasao Takasugi, Higashiyamato, Japan

[73] Assignee: Hitachi, Ltd., Tokyo, Japan

[21] Appl. No.: 455,293

[22] Filed: Jan. 3, 1983

[30] Foreign Application Priority Data

Jan. 6, 1982 [JP] Japan .................................. 57-337
Mar. 19, 1982 [JP] Japan ................................ 57-42756

[51] Int. Cl.³ ........................ G11B 7/00; G11B 27/36
[52] U.S. Cl. .................................. 369/54; 369/106; 369/116; 369/122; 250/205
[58] Field of Search ................... 369/54, 58, 106, 116, 369/121, 122; 250/205; 346/76 L

[56] References Cited

U.S. PATENT DOCUMENTS 4,051,329 9/1977 Blondet ............................. 369/116
4,283,785 8/1981 Miyouchi ........................... 369/121

OTHER PUBLICATIONS

"High Density Direct Read After Write (DRAW) Recording" by Pepperl's et al.; Optica Acta, 1977, vol. 24, No. 4, pp. 427–431.

*Primary Examiner*—Alan Faber
*Attorney, Agent, or Firm*—Antonelli, Terry & Wands

[57] ABSTRACT

An optical disc device including a semiconductor laser as a light source and making the light output of the semiconductor laser different between an information recording operation and an information reproducing operation is disclosed in which the semiconductor laser is connected in parallel with protection circuit, and in which the protection circuit is put in a short-circuited state between two terminals thereof when a monitor signal corresponding to the light output of the semiconductor laser exceeds a predetermined value.

3 Claims, 13 Drawing Figures

CONTROL CIRCUIT FOR CONTROLLING LIGHT SOURCE IN OPTICAL DISC DEVICE

The present invention relates to a control circuit for controlling a light source in an optical disc device, and more particularly to a control circuit suitable for controlling a semiconductor laser which is used as a light source in an optical disc device. The prior art "high density read after write recording" is disclosed in a literature "OPTICA ACTA", 1977, vol. 24, No. 4, pp 427–431.

In an optical disc device capable of recording and reproducing information, both recording and reproducing operations are performed by using the same optical head, and a semiconductor laser is used as a light source for the reasons that it is easy to modulate the output beam of the semiconductor laser and that the semiconductor laser is small in size and light in weight.

Further, in a recording mode, a pulsive laser beam having a power $P_W$ is emitted from the semiconductor laser in accordance with recording information, and then focused by the optical head on a recording film provided on an optical disc. That portion of the recording film which is irradiated with the focused laser beam, is changed in optical property, and thus the information is recorded in the film. On the other hand, in a reproducing mode, a laser beam having a constant power $P_R$ is focused by the optical head on the recording film, and the power $P_R$ is selected so that the portion of the recording film irradiated with the focused laser beam is not changed in optical property. In other words, only the power of the laser beam is different between the recording and reproducing operations. Therefore, when the laser power in the reproducing mode becomes far larger than an ordinary value for the reproducing operation due to a fault in and malfunction of a logic circuit or circuit element, there is a danger of erroneous recording being made or recorded information being destroyed. Accordingly, in the reproducing mode, it is required to keep the laser power below a value. Further, in the recording mode, it is necessary to put the laser power for recording within a predetermined range.

However, a conventional optical disc device capable of performing both of recording and reproducing operations, is not provided with the above-mentioned protection means. Further, the above-mentioned problem does not arise in an optical disc device for carrying out only the reproducing operation and other devices using a semiconductor laser. Accordingly, the above-mentioned problem is encountered only in the optical disc device for carrying out both recording and reproducing operations. The prior art is also described in a literature entitled "high density read after write recording" in "OPTICA ACTA", 1977, vol 24, No. 4, pp 427–431.

It is therefore an object of the present invention to provide protection means for putting the light output of a laser within an appropriate range in each of recording and reproducing periods (namely, writing and reading periods), thereby preventing erroneous recording.

In order to attain the above object, according to the present invention, the light output of a semiconductor laser is monitored by a monitor device, and protection means capable of short-circuiting the semiconductor laser when a monitor signal from the monitor device exceeds a predetermined value, is connected to the semiconductor laser.

The present invention will be apparent from the following detailed description taken in conjunction with the accompanying drawings, in which.

Figure 1:
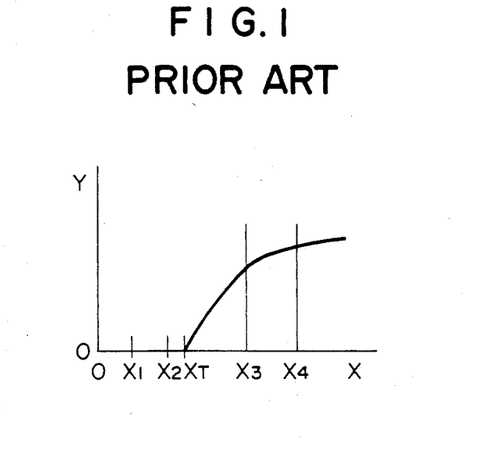
FIG. 1 is a graph showing a relation between the laser power on a recording film and the deformation of the recording film.

Prior to the explanation of the present invention, the laser power incident upon an optical disc and its effect on a recording film will first be described. FIG. 1 shows a relation between a laser power X on a recording film and a deformation Y of the recording film. Referring to FIG. 1, a laser power $X_T$ is a threshold power, and the deformation of the recording film does not occur for $X<X_T$ but occurs for $X_T<X$. That is, when a laser power X greater than the threshold power $X_T$ is given to the recording film, recording is carried out. In a reading period, the laser power X is made less than the threshold power $X_T$ in order not to deform the recording film, and moreover has to satisfy a relation $X_1 \leq X \leq X_2$ in order to carry out normal signal processing for the read-out signal. On the other hand, in a writing period, the laser power is made greater than the threshold power $X_T$, and moreover is required to put the deformation of the recording film within an appropriate range so that recorded information can be correctly read out. In more detail, when information is recorded by a laser beam having a power which is slightly greater than the threshold power $X_T$, a signal reproduced from the recorded information is weak and therefore readily affected by noise and other interference. Thus, it is impossible to correctly reproduce the information. On the other hand, when the deformation of the recording film is too large, recorded information and adjacent information overlap each other, and thus resolution is decreased. Accordingly, the laser power X in the writing operation is required to satisfy a relation $X_3<X<X_4$.

The erroneous recording is generated in the case where the laser power X deviates from the above-mentioned ranges $X_1 \leq X \leq X_2$ and $X_3 < X < X_4$ in the reading and writing operations. According to the present invention, it can be detected that the laser power has deviated from the above-mentioned ranges; and a protecting operation is performed in order not to make the erroneous recording.

Figure 2:
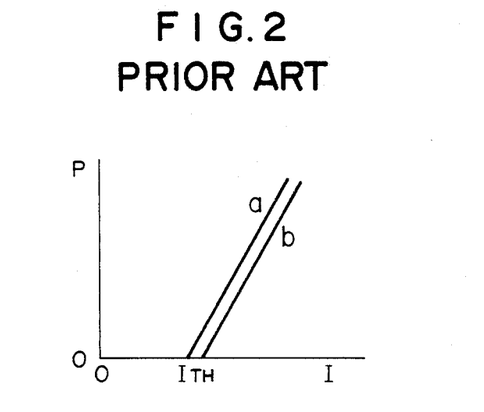
FIG. 2 is a graph showing relations between the current flowing through a semiconductor laser and the light output thereof.
Figure 3:
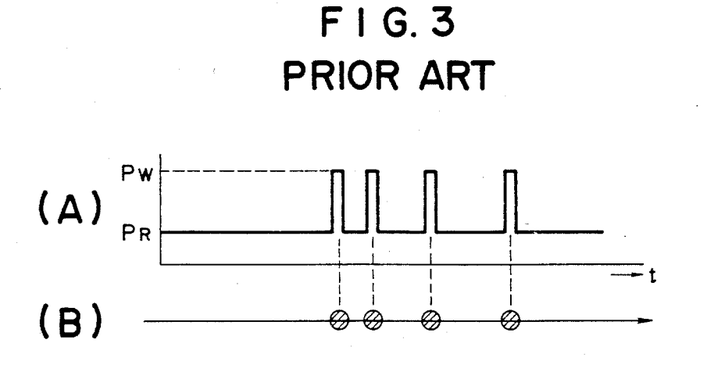
FIG. 3A is a waveform chart showing writing pulses.
FIG. 3B is a view showing recording pits.

FIG. 2 shows relations between current I supplied to a semiconductor laser and laser power P outputted therefrom. As shown in FIG. 2, the laser output power P increases in proportion to the current I in a range where the current I is greater than a threshold value $I_{th}$. The laser output is focused on a recording film by an optical system, and thus a fine laser spot is formed on the recording film. The current flowing through the semiconductor laser is controlled so that the laser output power lies within the above-mentioned ranges in the reading and writing operations. The input current vs. output power characteristic of the semiconductor laser varies with temperature and other variables as indicated by straight lines a and b in FIG. 2. Therefore, it is required to keep the laser output power at an appropriate value in spite of the above-mentioned variation. A continuous, constant laser power is used in the reading operation. In the writing operation, however, the laser power at an appropriate value in a pulse shape is used each time information is recorded in the recording film. FIGS. 3A and 3B show the above-mentioned fact. That is, the laser power in a pulse shape is increased to an appropriate value at positions where information pits are formed. In FIG. 3A, reference symbol $P_R$ indicates a laser power in the reading operation, and $P_W$ a laser power in the writing operation. FIG. 3B shows that information pits corresponding to writing pulses are formed in a recording film.

Figure 4:
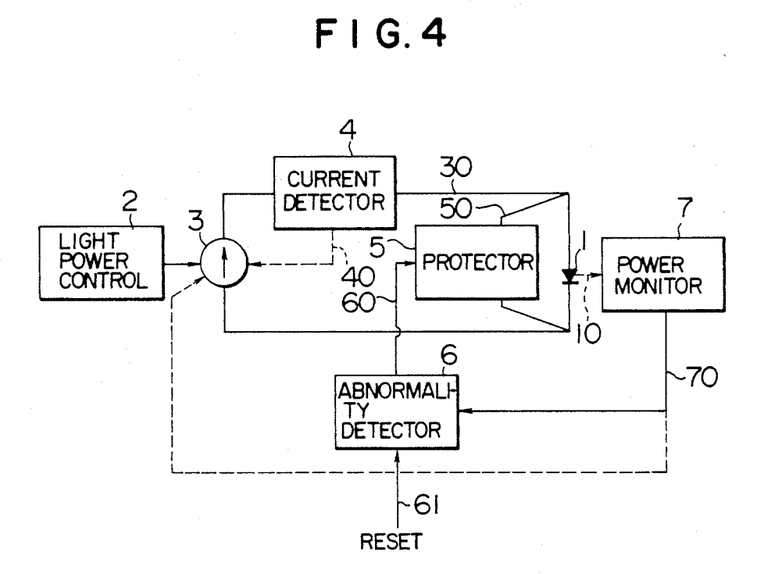
FIG. 4 is a block diagram showing the fundamental configuration of the present invention.

FIG. 4 shows the fundamental configuration of the present invention. In FIG. 4 reference numeral 1 designates a semiconductor laser, 2 a light power control circuit, 3 a current source for supplying a current to the laser 1, 4 a current detecting circuit, 5 protection means, 6 an abnormality detecting circuit, and 7 a monitor circuit for monitoring laser power. In an ordinary operation, a current 30 from the current source 3 flows into the semiconductor laser 1. In more detail, a constant current corresponding to the reading power $P_R$ is given to the laser 1 in the reading operation, and a pulse current corresponding to the writing power $P_W$ flows into the laser 1 in the writing operation. At this time, the resistance of the protection means 5 between two terminals thereof is sufficinetly high, and therefore a current 50 flowing into the protection means is substantially equal to zero. A part 10 of the output of the laser 1 is received by the power monitor circuit 7, and the output of the laser 1 is controlled at an appropriate value by a monitor signal 70 from the monitor circuit 7. The current source 3 performs such a control function. Further, the current detecting circuit 4 detects an overcurrent into the laser and prevents the overcurrent from flowing into the laser even if the light power control circuit fails for some reason.

The abnormality detecting circuit 6 detects that a laser power has deviated from an appropriate range in each of reading and writing operations, and supplies a signal 60 to the protection means 5 if the abnormality is detected. The resistance of the protection means 5 between two terminals thereof is decreased upon the application of the signal 60 thereto, and the current 30 flows through a by-pass 50 including the protection means 5. Thus, the current flowing into the laser 1 is made equal to zero or sufficiently small, thereby preventing the erroneous recording. The protection means 5 is connected in parallel with the laser 1 to by-pass the laser current, thereby protecting the laser 1. Further, another circuit configuration is readily thought of in which protection means is connected in series with the laser and the resistance of the protection means is made high when the abnormality occurs, to protect the laser. A characteristic feature of the present invention resides in that the current source 3 has the protecting function performed by the above-mentioned series combination, and moreover another protection means is connected in parallel with the laser. With such a circuit configuration, a reliable protection device can be obtained which can prevent the erroneous recording, that is, a fatal failure. Further, according to the present invention, a more reliable device can be obtained which includes means for informing the outside that the protecting operation is being performed, and which is provided with a logic circuit for returning an optical disc device to a normal operation, after the reason for the protecting operation has been clarified and it has been confirmed that the cause for the protecting operation is removed. For example, the abnormality detecting circuit 6 may be informed of the fact that the above-mentioned cause has been removed, by means of a confirmation signal 61, which is given manually or supplied from normality-confirming means not shown.

Figure 5:
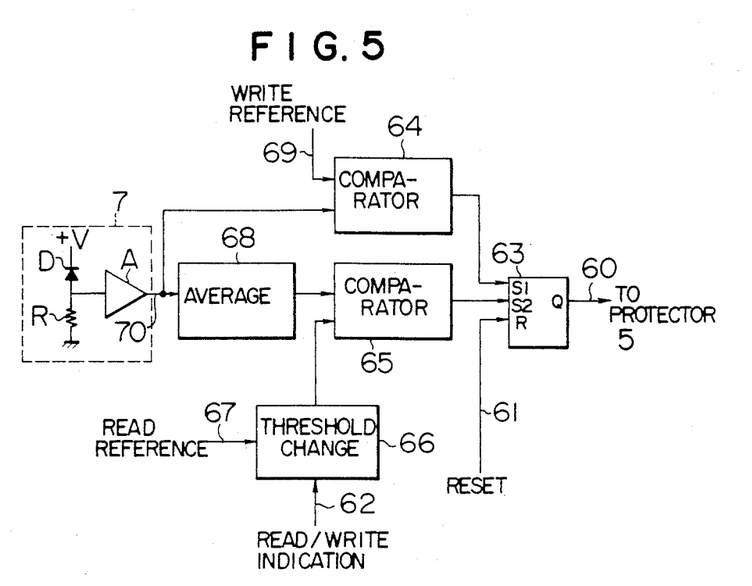
FIG. 5 is a block diagram showing an embodiment of the present invention.
Figure 6:
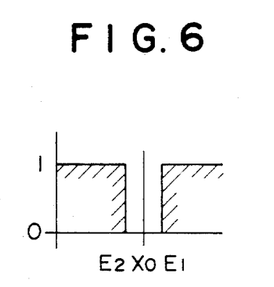
FIG. 6 is a graph showing an example of the characteristic of the comparators shown in FIG. 5.
Figure 7:
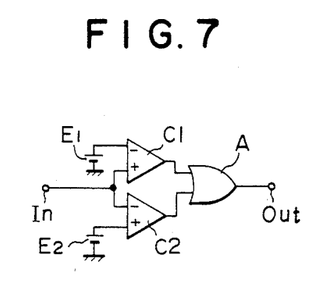
FIG. 7 is a circuit diagram showing an example of a comparator capable of producing the characteristic shown in FIG. 6.

Now, the present invention will be explained below in detail, on the basis of embodiments thereof. FIG. 5 shows the function arrangement of an abnormality detecting circuit included in an embodiment of the present invention. Referring to FIG. 5, a power monitoring circuit 7 is made up of a photodetector diode D, a load resistor R and an amplifier A, and delivers an output 70 in case of detecting light 10. In a reading operation, an output 70 has a constant value corresponding to the reading power. In a writing operation, the output 70 has a waveform corresponding to a pulse-shaped writing power. In FIG. 5, reference numeral 68 designates an averaging circuit having a time constant far longer than the period of writing pulses for delivering an average value of the monitor output 70, reference numeral 65 designates a comparator for detecting the deviation of the reading power from an appropriate range, 64 a comparator for detecting the deviation of the writing power from an appropriate range, 69 a reference signal indicating an appropriate value of the writing power, 67 a reference signal indicating an appropriate value of the reacting power, 62 a signal for indicating either reading or writing operations is now being performed and for correcting the reference signal 67 in a writing period, and 63 a flip-flop circuit whose set terminals are applied with the outputs of the comparators 64 and 65. When either one of the outputs of the comparators 64 and 65 takes a level of "1", the flip-flop circuit 63 is set. Each of the comparators 64 and 65 has such an input-output characteristic as shown in FIG. 6. That is, when the input lies in a range from $X_0 - \Delta X$ to $X_0 + \Delta X$ (where $X_0$ indicates a reference input), the output takes a level of "0". When the input devices from the above range, the output takes a level of "1". The comparator having such a characteristic is usually called a window comparator. FIG. 7 shows an example of the window comparator which includes two comparators C1 and C2. In FIG. 7, reference symbol $E_1$ designates a power source having a terminal voltage $X_0+\Delta X$, $E_2$ a power source having a terminal voltage $X_0-\Delta X$, A an OR circuit, In an input terminal, and Out an output terminal. In some cases, only the comparator C1 on the $X_0+\Delta X$ side is provided in order to simplify the circuit configuration. Such a simplified circuit can also perform an effective protecting function. In the comparator 64 provided for comparing the writing power, the reference input $X_0$ shown in FIG. 6 corresponds to the appropriate value $P_W$ of the writing power, and the inputs $X_0-\Delta X$ and $X_0+\Delta X$ correspond to the values $X_3$ and $X_4$ shown in FIG. 1, respectively. Further, in the comparator 65 for the reading power, the reference input $X_0$ corresponds to the appropriate value $P_R$ of the reading power, and the inputs $X_0-\Delta X$ and $X_0+\Delta X$ correspond to the values $X_1$ and $X_2$ shown in FIG. 1, respectively.

Figure 8:
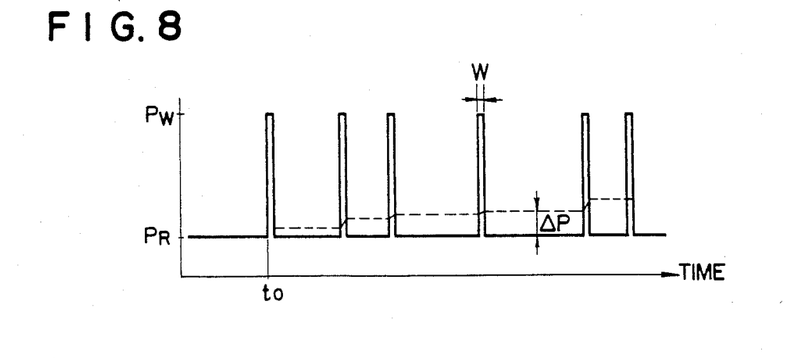
FIG. 8 is a waveform chart showing writing pulses used in a writing operation and the average power of the writing pulses.

Next, explanation will be made on the operation of the comparator 65 in a writing period. FIG. 8 shows the waveform of the laser power in the case where a reading operation is changed over to a writing operation. Referring to FIG. 8, let us assume that the power level between writing pulses in the writing period is equal to the power level in the reading period at a time equal to zero. Writing pulses appear in accordance with writing information, after a time moment $t_0$. Then, the average-in-time power level is higher than the power level in the reading level by $\Delta P$. When the reading power, the writing power, and the duty factor of the writing pulse v.s. the reading pulse are expressed $P_R$, $P_W$, and $D$, respectively, the above-mentioned difference $\Delta P$ is given by the following equation:

$$\Delta P = (P_W - P_R) D = P_R \left( \frac{P_W}{P_R} - 1 \right) D$$

Figure 9:
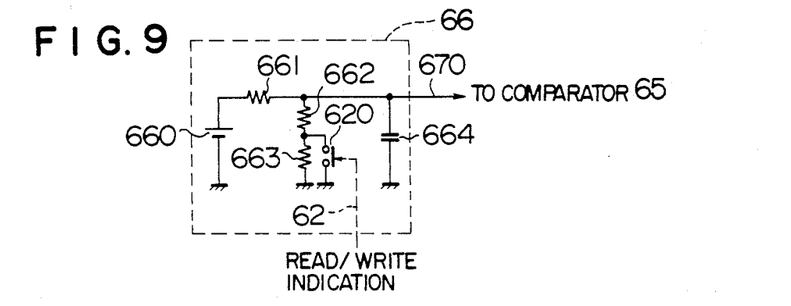
FIG. 9 is a circuit diagram showing an example of a circuit for obtaining a reference signal corresponding to an average power which varies with writing pulses.

Now, let us assume that a ratio $P_W/P_R$ has a value of 5 to 10 and the duty ratio D has a value of 1/5 to 1/20. Then, the difference $\Delta P$ becomes nearly equal to the reading power $P_R$. That is, the average power in the writing period is up to about twice larger than the reading power. Further, the duty ratio D of the writing pulse varies with the writing information pattern. Accordingly, the abnormality detecting threshold value on the reading side (namely, the reference input of the comparator 65) has to be corrected on the basis of the above facts. That is, in the writing period, the abnormality detecting threshold value on the reading side is increased by an amount corresponding to the difference $\Delta P$. The above-mentioned correction is carried out on the basis of the control signal 62 shown in FIG. 5, and the threshold value is increased by the threshold change means 66 by an amount corresponding to the difference $\Delta P$. FIG. 9 shows an actual example of the means 66 for varying the threshold value in accordance with the difference $\Delta P$. Referring to FIG. 9, the terminal voltage of a power supply 660 is divided into two parts by a voltage dividing circuit made up of resistors 661, 662 and 663, to obtain a reference voltage 670, which is applied to the comparator 65. The resistor 663 is short-circuited, on the basis of the ON-OFF action of a switch 620 which is controlled by the writing operation indicating signal 62. Thus, the threshold value at the comparator 65 can be changed. In the case where the writing pulses are used as the writing operation indicating signal 62 and a time constant determined by a capacitor 664, the resistor 661 and others is made equal to the time constant of the averaging circuit 68 shown in FIG. 5, the threshold value can be controlled more finely.

As mentioned above, the abnormality detecting circuit on the reading side is operated also in the writing period for the following reason. That is, in order to form an appropriate information pit, not only the amplitude of the writing pulse has to be put within a range but also the width thereof has to lie in a range. However, the comparator 64 on the writing side cannot detect the information with respect to pulse width. On the other hand, an averaging operation is performed on the reading side, and thus the pulse width is reflected in the output of the averaging circuit. This can be seen from the previously-mentioned fact that the difference $\Delta P$ is proportional to the duty ratio D. Thus, it is possible to prevent an error resulting from a too large pulse width which may be generated for some reason.

The protection means 5 can be formed of various elements which change over from a high-resistance state to a low-resistance state in response to the input control signal 60 and thus can by-pass the laser current. For example, an SCR and other semiconductor switching elements may be used as the protection means 5.

Figure 10:
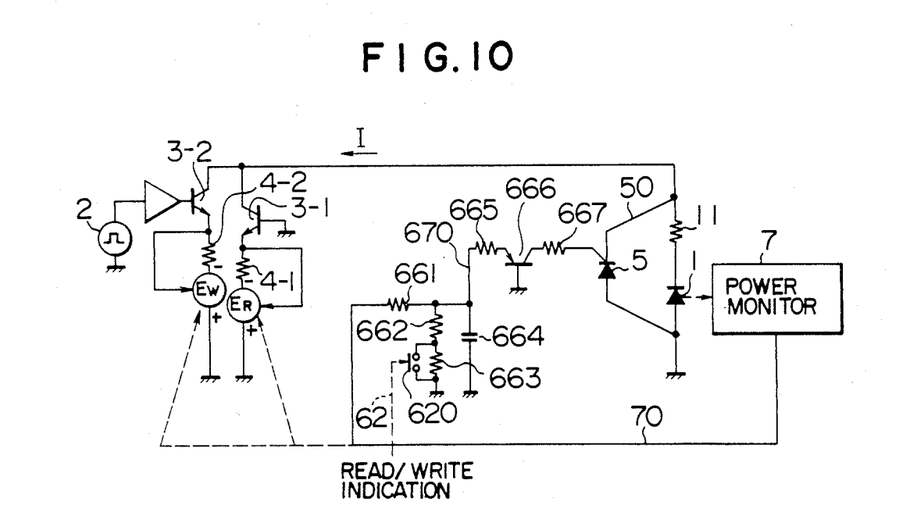
FIG. 10 is a circuit diagram showing another embodiment of the present invention in which protection means is controlled only by an abnormality detecting circuit on the reading side.

Further, it is effective from the practical point of view to use an abnormality detecting circuit which includes only either one of the detection circuit on the reading side and the detection circuit on the writing side. In the case where only the detection circuit on the reading side is used, since the difference $\Delta P$ contains information with respect to the amplitude and width of writing pulse as mentioned previously, the abnormality in the writing period can be detected, though the response time of the detection circuit becomes long due to the averaging processing. Accordingly, such a circuit is very effective from the practical point of view. FIG. 10 shows another example of the abnormality detecting circuit which includes only the detection circuit on the reading side, and in which the threshold value is given in a simplified manner. Referring to FIG. 10, a resistor 11 is connected in series with a semiconductor laser 1 to ensure the by-pass function of protection means 5. The protection means 5 is formed of an SCR, and connected in parallel with the laser 1. That is, a laser circuit including the laser 1 and resistor 11 is connected between the anode and cathode terminals of the SCR. When a current is supplied to the gate of the SCR 5, the SCR 5 turns on, and thus the laser current flows through the SCR 5. In the gate circuit of the SCR 5, a monitor output 70 from a power monitoring circuit 7 acts as the voltage source 660 shown in FIG. 9, and resistors 665 and 667 and a transistor 666 make up a gate current supplying circuit. An output 670 from a circuit corresponding to the circuit shown in FIG. 9 is supplied to the gate current supplying circuit. When the output 670 exceeds a threshold value to turn on the transistor 666 and also exceeds a threshold value of the gate current of the SCR, the SCR 5 turns on. Accordingly, a reference threshold value in the present abnormality detecting circuit is determined by the threshold values for operating the transistor 666 and SCR 5. Accordingly, circuit parameters in the above-mentioned circuit are selected so that the reference threshold value corresponds to a predetermined power threshold value. In FIG. 10, a transistor 3-1 and a resistor 4-1 make up a reading operation driving circuit, which is connected to a power supply $E_R$ to supply a predetermined current to the semiconductor laser 1. Similarly, a transistor 3-2 and a resistor 4-2 make up a writing operation driving circuit, which is connected to a power supply $E_W$ to supply a predetermined current to the laser 1.

Figure 11:
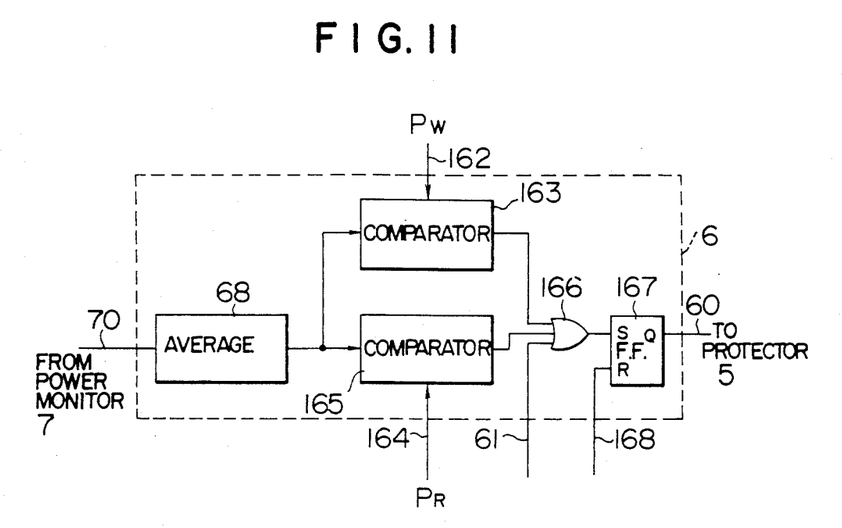
FIG. 11 is a block diagram showing a different example of the abnormality detecting circuit used in the present invention.

FIG. 11 shows a different example of the abnormality detecting circuit used in the present invention. Referring to FIG. 11, a power monitor signal 70 corresponding to the output power of a semiconductor laser is converted by an averaging circuit 68 into a time average value, which is compared by a comparator 165 with a set value ($P_R$) 164 of reading power. When the time average value deviates from a limited range, the comparator 165 delivers an output having a level of "1". Further, the power monitor signal 70 is applied directly to a comparator 163, to be compared with a set value ($P_W$) 162 of writing power. When the signal 70 deviates from a limited range, the comparator 163 delivers an output having a level of "1". These outputs of the comparators 165 and 163 pass through an OR circuit 166, and then set a flip-flop circuit 167. An output 60 from the flip-flop circuit 167 is used as a control signal for driving protection means connected in parallel with the semiconductor laser. In FIG. 11, none of the averaging circuit 68, comparators 163 and 165, OR circuit 166 and flip-flop circuit 167 are required to have a special characteristic, but may be ordinary circuit means. The power monitor signal for monitoring the output power of the laser may be the output current of a photodetector (for example, a photo-diode) which receives part of the light output of the laser. Alternatively, the power monitor signal may be a current flowing through the laser, for simplicity's sake. Each of the comparators 163 and 165 is set so as to deliver the output having a level of "1" before the output power of the laser is increased to a level at which erroneous recording may be generated. In the circuit shown in FIG. 11, the use of either one of the detection circuits (162 and 163) for the writing operation and the detection circuits (68, 164 and 165) for the reading operation is effective in its own way. Especially, when only the detection circuit (68, 164 and 165) for the reading operation is provided, a protecting operation can be performed even in the writing period, though the response time of the detection circuit is long.

Figure 12:
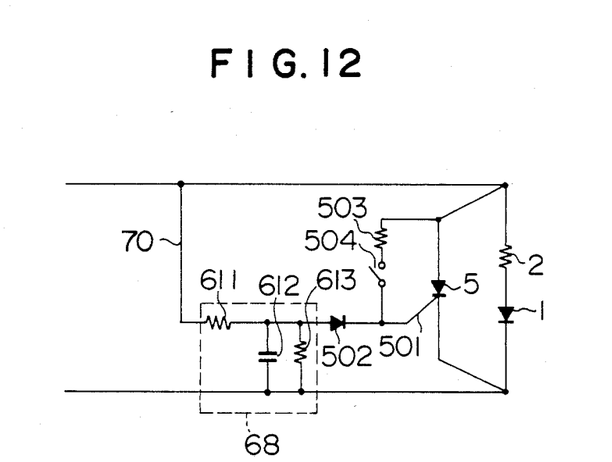
FIG. 12 is a circuit diagram showing a further example of the abnormality detecting circuit used in the present invention.

FIG. 12 shows a further example of the abnormality detecting circuit used in the present invention. The detection circuit (162 and 163) shown in FIG. 11 for the writing operation is not included in FIG. 12. In the circuit shown in FIG. 12, a signal proportional to the driving current of a semiconductor laser 1 is used as a monitor signal 70 for monitoring the output power of the laser 1. Further, an averaging circuit 68 is made up of a capacitor 612 and resistors 611 and 613, and an SCR 5 is used as protection means. The SCR 5 is connected in parallel with the laser 1 in such a manner that a series combination of the laser 1 and a resistor 2 is connected between the anode and cathode terminals of the SCR 5. The gate 501 of the SCR 5 is applied with the output of the averaging circuit 68 through a diode 502. The output of the averaging circuit 68, that is, the terminal voltage of a parallel combination of the capacitor 612 and resistor 613 is kept at a value corresponding to an ordinary reading power. When the reading power increases or the pulse height and width in the writing period increase, the output voltage of the averaging circuit 68 is increased. When the output voltage of the averaging circuit exceeds a threshold value for triggering the SCR 5 after having passed through the diode 502, the SCR 5 is put in the conductive state. The SCR 5 having been put in the conductive state is kept in the conductive state even when the triggering input is removed. Accordingly, the SCR 5 has the function of the flip-flop circuit 167 shown in FIG. 11. When the SCR 5 becomes conductive, the driving current of the laser 1 flows through the SCR 5, and thus it is possible to prevent a large power from making erroneous recording. In the example shown in FIG. 11, when the SCR 5 becomes conductive, that is, the output of the flip-flop circuit 167 has a level of "1", this output is sent to display or other means to work out an appropriate countermeasure. When the countermeasure has been completed, a reset signal 168 is applied to the flip-flop circuit 167, to return the circuit 167 to the ordinary state. In the example shown in FIG. 12, the SCR 5 is reset in such a manner that the current flowing through the SCR 5 is made less than a self-holding current thereof. As mentioned above, the diode 502 included in the gate circuit of the SCR 5 is used to increase the threshold value for triggering the SCR, and therefore may be replaced by a resistor or may be omitted in connection with other circuit constants. As is evident from the above-mentioned explanation, the gate circuit of the SCR 5 has the function of the comparator 165 shown in FIG. 11. Further, in FIG. 12, a circuit made up of a resistor 503 and a switch 504 is connected to the gate 501 of the SCR 5, to turn on the SCR by a control signal from a circuit other than the averaging circuit 68.

Although, in the example shown in FIG. 12, an SCR is used as the protection means, the protection means can be formed of various elements, except a mechanical contact which may generate a surge voltage in the ON-OFF action. However, it is undersirable to use a protection element having the property of disturbing the high-speed modulation for the laser light, for example, a protection element having an extremely large capacity.

As has been explained in the foregoing, according to the present invention, erroneous recording for some reason in a reading period can be prevented, and also formation in a writing period of too large or too small pits which cannot be correctly reproduced can be prevented. In an optical disc device in which reading and writing operations are performed by changing the laser power incident upon a recording film, the problem pointed out herein is unavoidable, and therefore protection means according to the present invention is indispensable. In the foregoing explanation, reading and writing operations are performed by using the same laser light. It is needless to say that the present invention is applicable to and effective in an optical disc device in which reading and writing operation are performed by using different laser lights or different optical heads.

I claim:

1. A control circuit for controlling a light source in an optical disc device in which a semiconductor laser is used as said light source and the light output of said semiconductor laser is made different between an information recording period for recording information on a predetermined recording medium and an information reproducing period therefrom, said control circuit comprising:

means for obtaining a monitor signal corresponding to the light output of said semiconductor laser;

abnormality detecting means for detecting that said monitor signal exceeds a predetermined value; and protection means connected in parallel with said semiconductor laser, said protection means being put in a short-circuited state between two terminals thereof by the output of said abnormality detecting means.

2. A control circuit according to claim 1, wherein said abnormality detecting means includes first means for obtaining an average value of said monitor signal, second means for comparing the output of said first means with a signal indicating an appropriate value of the light output of said semiconductor laser in said reproducing period, third means for comparing said monitor signal with a signal indicating an appropriate value of the light output of said semiconductor laser in said recording period, and fourth means for generating an output when applied with either one of the output of said second means and the output of said third means, and wherein said output of said fourth means is applied to said protection means.

3. A control circuit according to claim 1, wherein said abnormality detecting means includes first means for obtaining an average value of said monitor signal, fifth means connected to said first means and having a predetermined threshold value for generating an output when the output of said first means exceeds said threshold value, and sixth means connected to said fifth means and kept in a conductive state upon the output of said fifth means, and wherein said sixth means acts as said protection means.

* * * * *